(12) United States Patent
Suzuki et al.

(10) Patent No.: US 6,940,934 B2
(45) Date of Patent: Sep. 6, 2005

(54) SYNCHRONIZING SIGNAL PROCESSING CIRCUIT

(75) Inventors: Yoshito Suzuki, Tokyo (JP); Kouji Minami, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 743 days.

(21) Appl. No.: 09/961,245

(22) Filed: Sep. 25, 2001

(65) Prior Publication Data

US 2002/0168041 A1 Nov. 14, 2002

(30) Foreign Application Priority Data

May 10, 2001 (JP) ........................................ 2001-139626

(51) Int. Cl.[7] ................................................. H04L 7/00
(52) U.S. Cl. ....................... 375/354; 375/359; 375/362; 327/144; 327/160; 370/503; 370/514
(58) Field of Search ................................. 375/359, 364, 375/354; 327/141, 144, 160; 370/503, 514

(56) References Cited

U.S. PATENT DOCUMENTS 5,459,419 A * 10/1995 Hatakenaka ................. 327/141
5,497,202 A    3/1996 Kim et al.

FOREIGN PATENT DOCUMENTS

JP    A59110280    6/1984
JP    A09181938    11/1997

* cited by examiner

*Primary Examiner*—Jean B Corrielus
*Assistant Examiner*—Guillermo Munoz
(74) *Attorney, Agent, or Firm*—Birch, Stewart, Kolasch, & Birch, LLP

(57) ABSTRACT

A synchronizing signal processing circuit for use in a video apparatus such as a display apparatus and an information recording/reproducing is disclosed. The synchronizing signal processing circuit is capable of not only removing false synchronizing pulses included in incoming synchronizing signals and compensating for missing signals, but also causing its output to follow its input quickly after a phase of the incoming synchronizing signals has shifted abruptly.

10 Claims, 15 Drawing Sheets

SYNCHRONIZING SIGNAL PROCESSING CIRCUIT

FIELD OF THE INVENTION

The present invention relates to a synchronizing signal processing circuit for use in a video apparatus such as a display apparatus and an information recording/reproducing apparatus, particularly relates to a synchronizing signal processing circuit capable of outputting stable synchronizing signals having a small period variation by removing false synchronizing signals from incoming synchronizing signals and by compensating for missing synchronizing signals.

BACKGROUND OF THE INVENTION

Video apparatuses need stable synchronizing signals having a small period variation to display or record images. However, when radio waves received in an antenna are weak or when channel changing is made, a period of synchronizing signals can be disturbed temporarily. In addition, since false synchronizing signals such as equalizing pulses and cut-in pulses having frequencies which are integral multiples of the frequency of horizontal sync signals are included in each vertical retrace interval in order to ensure the continuity of the horizontal sync signals, a phase of reproduced synchronizing signals can shift abruptly at a switching point of a video head during video reproduction by a VCR. In order to avoid image quality degradation due to phase disturbance of synchronizing signals, a synchronizing signal processing circuit capable of correcting phase disturbance of incoming synchronizing signals is used to obtain synchronizing signals having a stable period.

FIG. 11 shows a structure of a horizontal sync signal processing circuit disclosed in Japanese Patent Publication No. 7-89653. This horizontal sync signal processing circuit includes an input terminal 20 for receiving horizontal sync signals, a noise eliminating circuit 21 for eliminating noises comprised of narrow pulses included in the horizontal sync signals entering at the input terminal 20, a timing pulse producing circuit 22 for producing timing pulses having a predetermined period on the basis of the output of an after-described mask circuit 25, a free-running synchronizing pulse producing circuit 23 for producing free-running synchronizing pulses when there are missing horizontal synchronizing signals on the basis of the outputs of the timing pulse producing circuit 22 and the mask circuit 25, a mode determination circuit 24 for determining an operation mode on the basis of outputs of the noise eliminating circuit 21, the free-running synchronizing pulse producing circuit 23, and the mask circuit 25, a synchronizing pulse producing circuit 26 for producing synchronizing pulses on the basis of the outputs of the free-running synchronizing pulse producing circuit 23 and the mask circuit 25, and an output terminal 27. The mask circuit 25 is for passing or blocking horizontal sync signals output from the noise eliminating circuit 21 by controlling its gate on the basis of the outputs of the timing pulse producing circuit 22 and the mode determination circuit 24.

The operation of the horizontal sync signal processing circuit having the structure as shown in FIG. 11 will be explained below. Here, assume that horizontal sync signals are negative-going pulse signals, that is, pulse signals of L (Low) level having a certain pulse width. The noise eliminating circuit 21, which includes a 4-bit shift register driven by a clock having a stable period produced by a quartz oscillator for example, brings its output to H (High) level only when the first two stages of the 4-bit shift register are at the L level and the last two stages of the register are at the H level. Thus, a noise pulse having a width shorter than a 2-clock period can be eliminated. When the output of the noise eliminating circuit 21 rises to the H level, it is meant that a falling edge or reference edge of a horizontal sync signal has been detected.

The timing pulse producing circuit 22 has a first counter which counts the above-described clock having a stable period, that is, a counter which is incremented by 1 each time a clock pulse is input. This first counter is reset when the output of the mask circuit 25 rises to the H level or when its count value reaches a predetermined first value. The first value is equivalent to a horizontal scanning period, that is, a period of the horizontal sync signals. Accordingly, the first counter is reset without exception when its count value reaches the value equivalent to the horizontal scanning period at most. When the count value of the first counter reaches the first value, the timing pulse producing circuit 22 resets the first counter and also produces a timing pulse and supplies it to the self-running synchronizing pulse producing circuit 23. In addition, the timing pulse producing circuit 22 produces another timing pulse and supplies it to the mask circuit 25 when the count value of the first counter reaches a second value equivalent to a time period that is slightly shorter than the horizontal scanning period. Here, the second value is equivalent to a time period which is shorter than the horizontal period by 5%. Accordingly, the timing pulse producing circuit 22 outputs a timing pulse to the mask circuit 25 when the count value of the first counter reaches a value equivalent to 95% of the horizontal scanning period.

The self-running synchronizing pulse producing circuit 23 includes a second counter. This second counter starts to count the clock in response to the timing pulse output from the timing pulse producing circuit 22, and stops the counting when the output of the mask circuit 25 rises to the H level or when its count value reaches a predetermined third value. Here, the third value is equivalent to 5% of the horizontal scanning period. The self-running synchronizing pulse producing circuit 23 produces a self-running synchronizing pulse when the count value of the second counter reaches the third value, and supplies it to the mode determination circuit 24, the mask circuit 25, and the synchronizing pulse producing circuit 26. Accordingly, if the self-running synchronizing pulse producing circuit 23 receives the timing pulse from the timing pulse producing circuit 22, it produces a self-running synchronizing pulse after a lapse of a time equivalent to 105% of the horizontal scanning period after the first counter starts to count the clock.

The mode determination circuit 24 includes a state machine which can be in either one of a synchronous state and a self-running state, and an octal counter. The state machine inverts its state each time the octal counter counts up to 8. When the state machine is in the synchronous state, the octal counter increases its count value by one each time a false synchronizing pulse or a self-running synchronizing pulse produced by the self-running synchronizing pulse producing circuit 23 is input, and resets its count value to zero each time a true synchronizing pulse is input. On the other hand, if the state machine is in the self-running state, the octal counter resets its count value to zero each time a false synchronizing pulse or a self-running synchronizing pulse is input, and increases its count value by one each time a true synchronizing pulse is input. Accordingly, the state machine changes from the self-running state to the synchronous state when eight true synchronizing pulses alone enter the state machine consecutively, and changes from the synchronous state to the self-running state when eight false or self-running synchronizing pulses alone enter the state machine consecutively. The state of the state machine is output to the mask circuit 25. Discrimination between the true synchronizing pulse and the false synchronizing pulse can be made from the state of a gate within the mask circuit 25 at the instant when the output of the noise eliminating circuit 21 rises to the H level, or a falling edge of an incoming synchronizing signal is detected. To be more specific, a pulse output from the noise eliminating circuit 21 when the gate within the mask circuit 25 is open is a true synchronizing pulse, while a pulse output from the noise eliminating circuit 25 when the gate within the mask circuit 25 is closed is a false synchronizing pulse.

The mask circuit 25 has a device for producing a gate signal by which the closing and opening of the gate within the mask circuit is controlled. The gate signal produced by this device is at the H level until the output of the gate rises to the H level after the mask circuit 25 receives a timing pulse from the timing pulse producing circuit 22 to open the gate, while it is at the L level at other times to close the gate. If the gate signal is at the H level, the output of the noise eliminating circuit 21 becomes the output of the gate. On the other hand, if the gate signal is at the L level, the output of the gate is kept at the L level irrespective of the output of the noise eliminating circuit 21. This gate signal is output to the mode determination circuit 24. The mask circuit 25 supplies the output of the gate to the timing pulse producing circuit 22, the self-running synchronizing pulse producing circuit 23, and the synchronizing pulse producing circuit 26 if the output of the mode determination circuit 24 indicates the synchronous state. On the other hand, they are supplied with the output of the noise eliminating circuit 21 if the output of the mode determination circuit 24 indicates the self-running state.

The synchronizing pulse producing circuit 26 outputs horizontal sync signals having a desired pulse width from the output terminal 27 by keeping its output at the L level for a predetermined time period after the moment at which the output of the mask circuit 25 is brought to the H level or after the moment at which the self-running synchronizing pulse producing circuit 23 produces a self-running synchronizing pulse.

FIGS. 12, 13 and 14 are timing charts showing waveforms of horizontal sync signals entering at the input terminal 20, gate signals in the mask circuit 25, self-running synchronizing pulses produced by the self-running synchronizing pulse producing circuit 23, and horizontal sync signals outgoing from the output terminal 27. T0 in these FIGS. represents a period of the incoming horizontal sync signals.

FIG. 12 shows a case where incoming horizontal sync signal includes false synchronizing pulses of a short period. As long as the horizontal sync signals are input at regular intervals of T0, the gate is closed each time a horizontal sync signal is input until a time period equivalent to 95% of the horizontal scanning period elapses when the timing pulse producing circuit 22 produces a timing pulse. Therefore, false pulses of a short period are blocked by the gate, whereby disturbance of horizontal synchronization due to false pulses can be avoided.

FIG. 13 shows a case where horizontal sync signals entering at the input terminal 20 has an apparent period of 2T0 because one of them is lost. If a horizontal sync signal is not detected while the gate is open, the self-running synchronizing pulse producing circuit 23 produces a self-running synchronizing pulse after a lapse of a time period equivalent to 105% of the horizontal scanning period after the last synchronizing pulse is input. It is possible to avoid disturbance of horizontal synchronization by outputting this self-running synchronizing pulse as a horizontal sync pulse by way of the synchronizing pulse producing circuit 26.

FIG. 14 shows a case where horizontal sync signals cease entering at the input terminal 20 at some point in time. In this case, a first self-running synchronizing pulse is produced after a lapse of a time period equivalent to 105% of the horizontal scanning period after the last synchronizing pulse is input. On the other hand, a second and subsequent self-running synchronizing pulses are produced at intervals of T0 which is equal to the original horizontal scanning period, since the first counter within the timing pulse producing circuit 22 is reset at intervals of T0.

OBJECT AND SUMMARY OF THE INVENTION

With the above-described horizontal sync signal processing circuit, it is possible to obtain stable horizontal sync signals by removing false synchronizing pulses and compensating for missing synchronizing pulses. However, the above-described conventional synchronizing signal processing circuit is used on the premise that incoming synchronizing signals have a period (or multiples of the period) that is fundamentally constant and have continuity in phase if false synchronizing pulses are included therein or there is a momentary loss of a pulse therein, and that the phase of the incoming synchronizing signals does not shift abruptly.

However, abrupt phase shift can occur to reproduced synchronizing signals during video reproduction by a VCR for example. The above-described conventional synchronizing signal processing circuit is not able to synchronize its output with its input quickly when such abrupt phase shift has occurred. For example, consider a case shown in FIG. 15, where, when horizontal sync signals are being input at regular intervals of T0, abrupt phase shift occurs at some point in time so that two synchronizing signals are input in succession within a very short time period, and then, horizontal sync signals are input at regular intervals of T0 again. In such a case, it takes some time for the synchronizing signal processing circuit to synchronize its output with its input after the abrupt phase shift.

A time period during which the gate signal in the mask circuit 25 is at the H level and accordingly the gate is open appears each time a time equal to T0 elapses after the last horizontal sync signal before the phase shift has passed through the gate. These time periods respectively start 5% of T0 before their centers appearing at the time intervals of T0 and end 5% of T0 after their centers.

Accordingly, horizontal sync signals may appear while the gate is closed after the abrupt phase shift depending on the amount of the phase shift. In that case, they are blocked by the gate. In such a case, what the synchronizing signal processing circuit outputs are synchronizing signals in synchronization with self-running synchronizing pulses and not in synchronization with incoming synchronizing signals as shown in FIG. 15. Accordingly, the conventional synchronizing signal processing circuit is provided with a facility of counting self-running synchronizing pulses produced by the self-running synchronizing pulse producing circuit 23 or counting horizontal sync signals that have been blocked by the gate, and changing the state machine of the mode determination circuit 24 from the synchronous state to the self-running state to keep the gate open when they have been counted up to 8 consecutively.

However, since it takes a considerable time for the state change to occur, an upper part of a screen of a display apparatus can be distorted due to synchronization impairment. Furthermore, since a phase of incoming horizontal sync signals after the abrupt phase shift is often considerably different from that before the abrupt phase shift, a first pulse entering the processing circuit after the gate is kept open can be a false synchronizing pulse such as an equalizing pulse or a cut-in pulse.

In order to shorten the time required for the state change to occur, it is possible to use a binary counter instead of the octal counter so that the state change occurs when two self-running synchronizing pulses or two horizontal sync signals blocked by the gate have been counted. However, in that case, if three false synchronizing pulses are input in succession, the third false synchronizing pulse is output as a horizontal sync signal, as shown in FIG. 16.

Incidentally, Japanese Patent No. 2838995 describes a horizontal sync signal processing circuit provided with a structure for causing its output to follow its input quickly by resetting a counter forcibly when a phase shift of incoming synchronizing signals is detected. However, this patent does not disclose concrete method of detecting the phase shift or method of determining a timing at which the counter is reset.

The present invention has been made to solve the above-described problems with an object of providing a synchronizing signal processing circuit capable of not only removing false synchronizing pulses included in incoming synchronizing signals and compensating for missing signals, but also causing its output to follow its input quickly after a phase of the incoming synchronizing signals has shifted abruptly.

The above-described object is achieved by a synchronizing signal processing circuit for producing, from a first synchronizing signal entering thereto, a second synchronizing signal to be output therefrom, the synchronizing signal processing circuit comprising:

a first counter counting a clock of a predetermined frequency and being reset each time an entry of the first synchronizing signal is detected;

a first gate signal producing circuit for producing a first gate signal which changes to an open state when a count value of the first counter reaches a first value, and changes to a closed state when the first counter is reset and when the count value of the first counter reaches a second value larger than the first value;

a second counter counting the clock and being reset upon each reception of a reset signal;

a self-running synchronizing pulse producing circuit for producing a self-running synchronizing pulse when a count value of the second counter reaches the second value;

a second gate signal producing circuit for producing a second gate signal which changes to the open state when the count value of the second counter reaches the first value, and changes to the closed state when the second counter is reset;

a first gate circuit allowing the first synchronizing signal to pass when at least one of the first and the second gate signals indicates the open state, and blocking the first synchronizing signal at other times;

a synchronizing pulse producing circuit for producing a synchronizing pulse to be output as the second synchronizing signal upon reception of the first synchronizing signal from the first gate circuit and upon reception of the self-running synchronizing pulse from the self-running synchronizing pulse producing circuit; and a reset signal producing circuit outputting the reset signal to the second counter upon reception of the first synchronizing signal from the first gate circuit and upon reception of the self-running synchronizing pulse from the self-running synchronizing pulse producing circuit.

The above-described object is achieved also by a synchronizing signal processing circuit for producing, from a first synchronizing signal entering thereto, a second synchronizing signal to be output therefrom, the synchronizing signal processing circuit comprising:

a first counter counting a clock of a predetermined frequency and being reset each time an entry of the first synchronizing signal is detected;

a first gate signal producing circuit for producing a first gate signal which changes to an open state when a count value of the first counter reaches a first value, and changes to a closed state when the first counter is reset and when the count value of the first counter reaches a second value larger than the first value;

a second counter counting the clock and being reset upon each reception of a reset signal; a self-running synchronizing pulse producing circuit for producing a self-running synchronizing pulse when a count value of the second counter reaches the second value;

a second gate signal producing circuit for producing a second gate signal which changes to the open state when the count value of the second counter reaches the first value, and changes to the closed state when the second counter is reset;

a first gate circuit allowing the first synchronizing signal to pass when at least one of the first and the second gate signals indicates the open state, and blocking the first synchronizing signal at other times;

a second gate circuit allowing the first synchronizing signal to pass when the second gate signal indicates the open state, and blocking the first synchronizing signal at other times;

a synchronizing pulse producing circuit for producing a synchronizing pulse to be output as the second synchronizing signal upon reception of the first synchronizing signal from the second gate circuit and upon reception of the self-running synchronizing pulse from the self-running synchronizing pulse producing circuit;

a reset signal producing circuit outputting the reset signal to the second counter upon reception of the first synchronizing signal from the first gate circuit and upon reception of the self-running synchronizing pulse from the self-running synchronizing pulse producing circuit.

The synchronizing signal processing circuits may further comprise a mode determination circuit which sets a self-running mode flag when the count value of the second counter reaches the second value and clears the self-running mode flag when the first synchronizing signal passes through the first gate circuit;

the self-running synchronizing pulse producing circuit producing the self-running synchronizing pulse when the count value of the second counter reaches the second value if the self-running mode flag is cleared, and when the count value of the second counter reaches a third value larger than the first value and smaller than the second value if the self-running mode flag is set;

the second gate signal produced by the second gate signal producing circuit changing to the open state when the count value of the second counter reaches the first value if the self-running mode flag is cleared, and when the count value of the second counter reaches a fourth value smaller than the first value if the self-running mode flag is set.

The synchronizing signal processing circuits may further comprise a selection signal producing circuit for producing a selection signal which is set when an entry of the first synchronizing signal is detected if the self-running mode flag is cleared and the first gate signal indicates the closed state, and reset when the count value of the second counter reaches the third value if the self-running mode flag is set and when the first synchronizing signal passes through the first gate circuit irrespective of a state of the self-running mode flag;

the synchronizing pulse producing circuit producing a synchronizing pulse to be output as the second synchronizing signal upon reception of the first synchronizing signal from the second gate circuit and upon reception of the self-running synchronizing pulse from the self-running synchronizing pulse producing circuit if the selection is reset, while outputting the first synchronizing signal that has passed the first gate circuit as the second synchronizing signal if the selection signal is set.

The first synchronizing signal may be a vertical synchronizing signal, and the first and the second counters may be supplied with a horizontal synchronizing signal as the clock.

The synchronizing signal processing circuits may further comprise a period detecting circuit for detecting a period of the first synchronizing signal, and a device for determining the first to fourth values on the basis of a value of the period detected by the period detecting circuit.

BRIEF DESCRIPTION OF THE DRAWINGS

Embodiments of the invention will now be described by way of example and with reference to the accompanying drawings in which.

DESCRIPTION OF THE PREFERRED EMBODIMENTS

Figure 1:
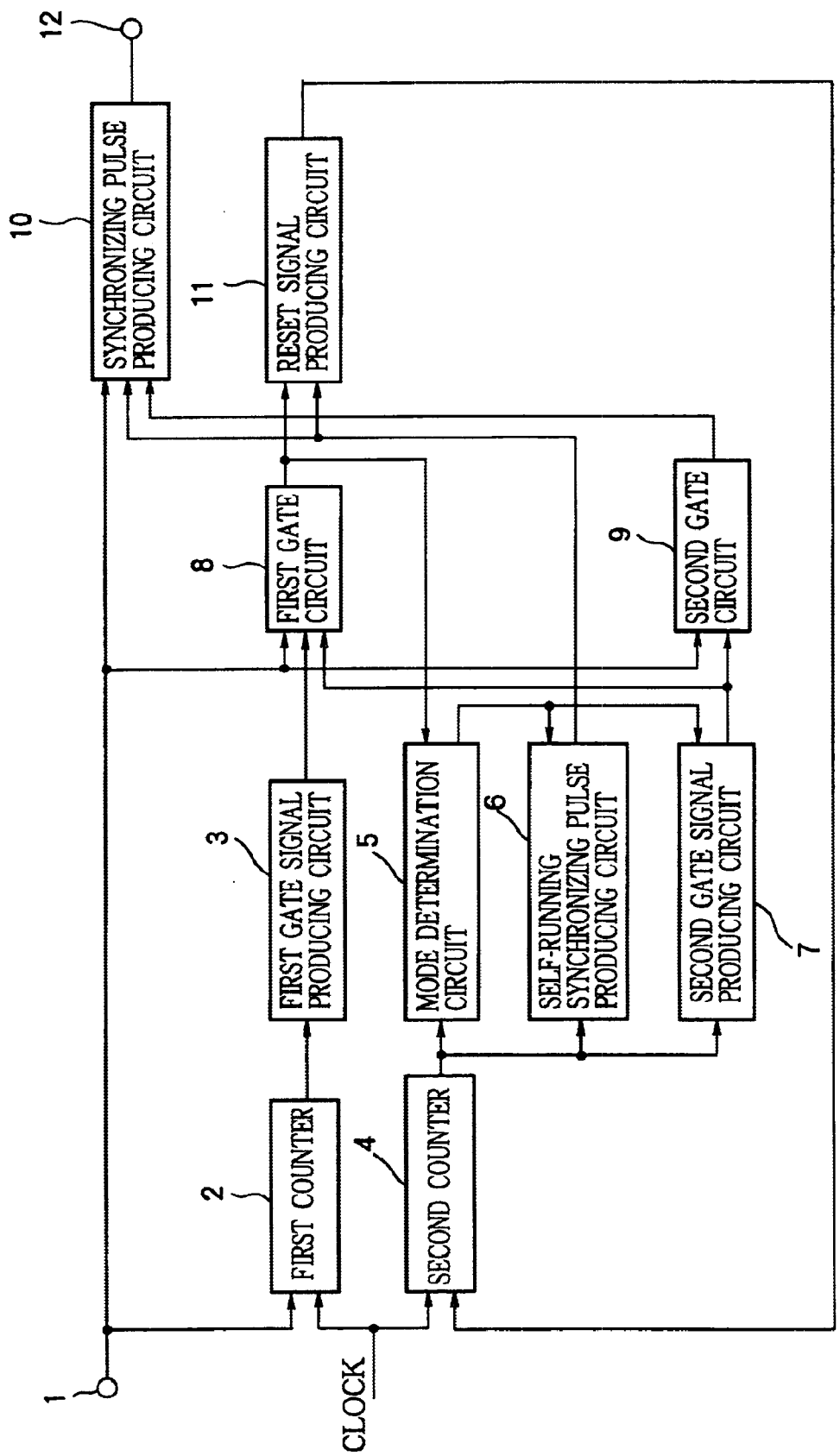
FIG. 1 is a block diagram showing a structure of a first example of the synchronizing signal processing circuit according to the present invention.

FIG. 1 is a block diagram showing a structure of a synchronizing signal processing circuit of a first example according to invention. In FIG. 1, 1 denotes an input terminal for receiving synchronizing signals, 2 denotes a first counter counting a clock of a predetermined frequency and being reset to 0 each time a synchronizing signal enters through the input terminal 1,3 denotes a first gate signal producing circuit for producing a first gate signal which indicates an open state after the count value of the first counter 2 reaches a predetermined first value and indicates a closed state after the first counter 2 is reset or after the count value of the first counter 2 reaches a second value larger than the first value, 4 denotes a second counter counting the clock and being reset to 0 by a reset signal produced by an after-described reset signal producing circuit 11, 5 denotes a mode determination circuit which sets a self-running mode flag to be supplied to an after-described self-running synchronizing pulse producing circuit 6 and a second gate signal producing circuit 7 when the count value of the second counter 4 reaches the second value, and clears the flag when a synchronizing signal entering through the input terminal 1 passes through an after-described first gate circuit 8, 6 denotes the self-running synchronizing pulse producing circuit which produces a self-running synchronizing pulse when the count value of the second counter 4 reaches the second value if the self-running mode flag is cleared by the mode determination circuit 5, and when the count value of the second counter 4 reaches a third value larger than the first value and smaller than the second value if the self-running mode flag is set, 7 denotes the second gate signal producing circuit for producing a second gate signal which indicates the open state after the count value of the second counter 4 reaches the first value if the self-running mode flag is cleared and after the count value of the second counter 4 reaches a fourth value smaller than the first value if the self-running mode flag is set, and indicates the closed state after the second counter 4 is reset irrespective of the state of the self-running mode flag, 8 denotes the first gate circuit allowing a synchronizing signal entering at the input terminal 1 to pass when at least one of the first gate signal and the second gate signal indicates the open state and blocking it when both of them indicate the closed state, 9 denotes a second gate circuit allowing a synchronizing signal entering through the input terminal 1 to pass when the second gate signal produced by the second gate signal producing circuit 7 indicates the open state and blocking it when the second gate signal indicates the closed state, 10 denotes a synchronizing pulse producing circuit which produces a synchronizing pulse having a predetermined duration from a synchronizing signal that has passed through the second gate circuit 9 and a synchronizing signal entering through the input terminal 1, and outputs this produced synchronizing pulse or a self-running synchronizing pulse produced by the self-running synchronizing pulse producing circuit 6 as a synchronizing signal to the outside, 11 denotes the reset signal producing circuit producing a reset signal upon reception of a synchronizing signal that has passed through the first gate circuit 8 or a self-running synchronizing pulse produced by the self-running synchronizing pulse producing circuit 6, and 12 denotes an output terminal.

The operation of the first example of the synchronizing signal processing circuit shown in FIG. 1 will now be explained for a case where synchronizing signals to be processed is horizontal sync signals. In this example, the first value is set to Tc−Tj, the second value is set to Tc+Tj, the third value is set to Tc, and the fourth value is set to Tc−2Tj, where Tj is a maximum admissible width of jitters of horizontal sync signals, and Tc is a period of the horizontal sync signals after false synchronizing pulses are removed completely. Here, horizontal sync signals entering through the input terminal 1 are negative-going pulses or L-level pulses.

The first counter 2 is incremented by 1 each time a clock pulse is input and resets to 0 each time a rising edge of a horizontal sync signal is detected as a reference edge. When the count value of the first counter 2 has reached a value equivalent to Tc−Tj, the first gate signal produced by the first gate signal producing circuit 3 changes from the closed state to the open state. This closed state continues until the first counter 2 is reset by a horizontal sync signal entering through the input terminal 1, or the count value of the first counter 2 reaches a value equivalent to Tc+Tj. Accordingly, the first gate circuit 8 allows a horizontal sync signal entering through the input terminal 1 to pass while the count value of the first counter 2 is between Tc−Tj and Tc+Tj.

The output of the first gate circuit 8 is supplied to the second counter 4 by way of the reset signal producing circuit 11 as a reset signal, and therefore, the second counter 4 is reset by the sync signal entering through the input terminal 1 as well while the count value of the first counter 2 is between Tc−Tj and Tc+Tj. The self-running synchronizing pulse producing circuit 6 produces a self-running synchronizing pulse which is a negative-going pulse having a predetermined duration when the count value of the second counter 4 reaches a value equivalent to Tc+Tj if the self-running mode flag is cleared by the mode determination circuit 5, or when the count value of the second counter 4 reaches a value equivalent to Tc if the self-running mode flag is set by the mode determination circuit 5. The self-running synchronizing pulse produced by the self-running synchronizing pulse producing circuit 6 is supplied to the reset signal producing circuit 11. The reset signal producing circuit 11 feeds a falling edge of the self-running synchronizing pulse back to the second counter 4 as a reset signal. Accordingly, the second counter 4 is reset without exception when the count value of the second counter 4 reaches the value equivalent to Tc+Tj or the value equivalent to Tc depending on the self-running mode flag.

The self-running mode flag is set by the mode determination circuit 5 when the count value of the second counter 4 reaches the value equivalent to Tc+Tj. Once the self-running mode flag is set, the second counter 4 is reset when its count value reaches the value equivalent to Tc at most. Accordingly, although a first self-running synchronizing pulse is produced after a lapse of Tc+Tj after the last synchronizing pulse is input before the self-running mode flag is set, subsequent self-running synchronizing pulses are produced at intervals of Tc.

As described above, the second gate signal producing circuit 7 produces a gate signal which indicates the open state after the count value of the second counter 4 reaches the value equivalent to Tc−Tj if the self-running mode flag is cleared by the mode determination 5 and indicates the closed state after the second counter 4 is reset by the reset signal produced by the reset signal producing circuit 11. Since a self-running synchronizing pulse is produced to reset the second counter 4 only when the count value of the second counter 4 reaches the value equivalent to Tc+Tj as long as the self-running mode flag is cleared, a time period during which the second gate circuit 9 is open substantially coincides with a time period during which the count value of the second counter 4 is between the value equivalent to Tc−Tj and the value equivalent to Tc+Tj as long as the self-running mode flag is cleared.

The second gate signal producing circuit 7 also produces another gate signal which indicates the open state after the count value of the second counter 4 reaches a value equivalent to Tc−2Tj if the self-running mode flag is set and indicates the closed state after the second counter 4 is reset. Since a self-running synchronizing pulse is produced to reset the second counter 4 only when the count value of the second counter 4 reaches the value equivalent to Tc as long as the self-running mode flag is set, a time period during which the second gate circuit 9 is open substantially coincides with a time period during which the count value of the second counter 4 is between the value equivalent to Tc−2Tj and the value equivalent to Tc as long as the self-running mode flag is set.

The synchronizing pulse producing circuit 10 produces an L-level pulse having a duration equal to a time that elapses until the input terminal 1 rises to the H level after the output of the second gate circuit 9 falls to the L level, and outputs it to the outside as a horizontal sync signal through the output terminal 12. On the other hand, when the self-running synchronizing pulse producing circuit 6 has produced a self-running synchronizing pulse, the synchronizing pulse producing circuit 10 outputs it to the outside as a horizontal sync signal through the output terminal 12.

The synchronizing pulse producing circuit 10 outputs a horizontal sync signal when supplied with either an output of the second gate circuit 9 or a self-running synchronizing pulse produced by the self-running synchronizing pulse producing circuit 6. Accordingly, when the first gate signal indicates the open state and the second gate signal indicates the closed state, a synchronizing signal appearing at the output terminal 12 has a period between Tc−Tj and Tc+Tj if the self-running mode flag is cleared, or between Tc−2Tj and Tc if it is set as long as any horizontal sync signal does not enter at the input terminal 1.

The operation of the first example of the synchronizing signal processing circuit according to the invention will now be described in detail with reference to timing charts shown in FIGS. 2 to 6. In these timing charts are shown horizontal sync signals entering at the input terminal 1, first gate signals produced by the first gate signal producing circuit 3, second gate signals produced by the second gate signal producing circuit 7, self-running synchronizing signals produced by the self-running synchronizing signal producing circuit 6, self-running mode flags output from the mode determination circuit 5, and horizontal sync signals output from the output terminal 12. Here, the first and second gate signals show the open state when they are at the H level, and show the closed state when they are at the L level.

Figure 2:
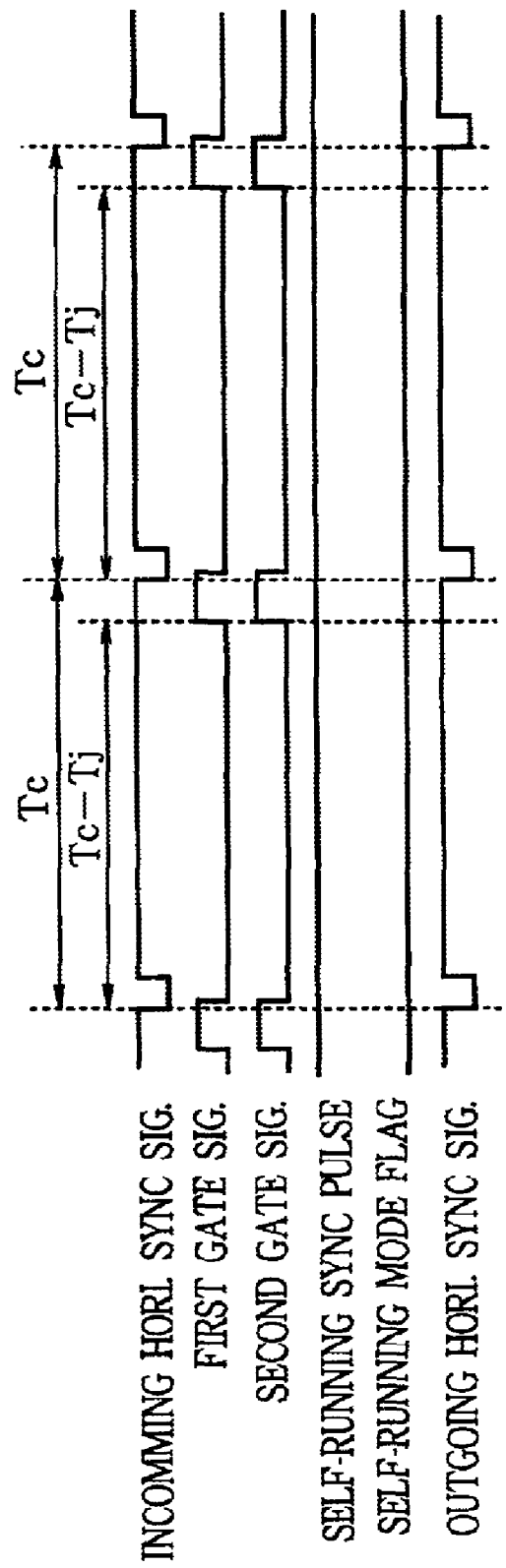
FIG. 2 is a timing chart for explaining the operation of the first example.

FIG. 2 shows a case where horizontals sync signals are entering at the input terminal 1 at regular intervals of Tc. In this case, the first counter 2 and the second counter 4 are always reset in the same timing. Accordingly, both of the first gate circuit 8 and the second gate circuit 9 open after a lapse of Tc−Tj after a horizontal sync signal enters at the input terminal 1, so horizontal sync signals entering at the input terminal 1 at intervals of Tc can pass through the first gate circuit 8 and the second gate circuit 9. Accordingly, the self-running synchronizing pulse producing circuit 6 does not produce any self-running synchronizing pulse, and therefore, synchronizing signals output from the output terminal 12 are identical with horizontal sync signals entering at the input terminal 1.

Figure 3:
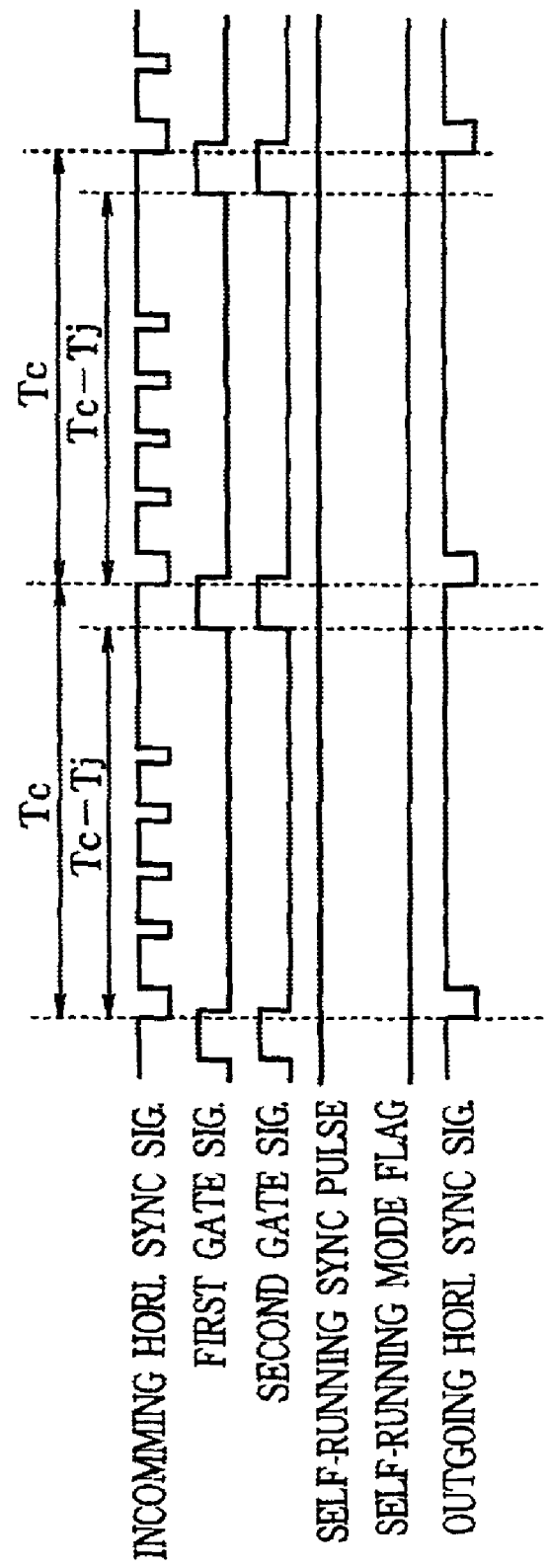
FIG. 3 is a timing chart for explaining the operation of the first example.

FIG. 3 shows a case where four false synchronizing pulses having a short period enter at the input terminal 1 in succession. These false synchronizing pulses having the short period cannot pass through either of the first gate circuit 8 and the second gate circuit 9 since they come in while both of the first and the second gate signals indicate the closed state.

Figure 4:
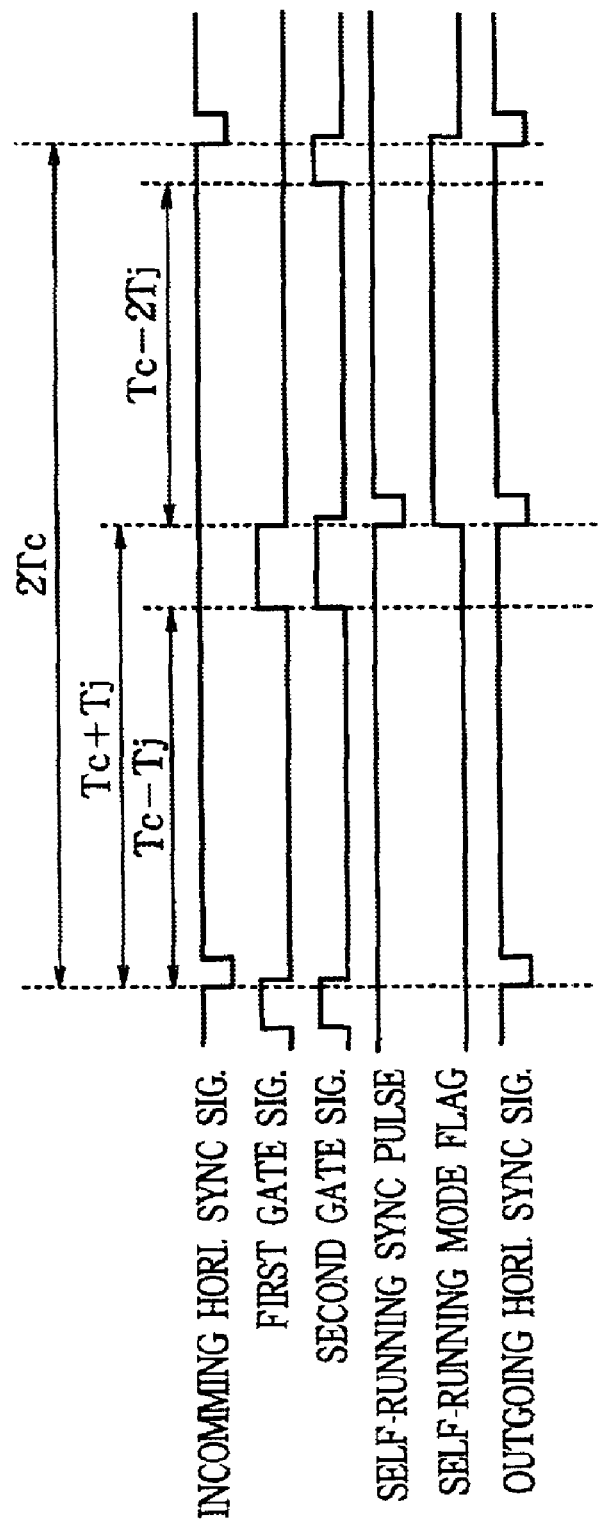
FIG. 4 is a timing chart for explaining the operation of the first example.

FIG. 4 shows a case where one horizontal sync signal to be input through the input terminal 1 is lost, and therefore the period of the horizontal sync signals becomes 2Tc apparently. If a horizontal sync signal to be input is not detected while at least one of the first gate signal and the second gate signal indicates the open state, a self-running synchronizing pulse is produced after a lapse of Tc+Tj after the last horizontal sync signal is input. By outputting this self-running synchronizing pulse from the synchronizing pulse producing circuit 10 as a horizontal sync signal, it is possible to avoid the occurrence of abrupt phase shift. Since the mode determination circuit 5 sets the self-running mode flag when the self-running synchronizing pulse has been produced, a time period during which the second gate signal indicates the open state starts after a lapse of Tc−2Tj after the self-running synchronizing pulse is produced and continues until a time of Tc elapses. Accordingly, a horizontal sync signal entering at the input terminal 1 after a lapse of 2Tc after the last horizontal sync signal enters at the input terminal 1 before the change of the period can pass through both of the first gate circuit 8 and the second gate circuit 9.

Figure 5:
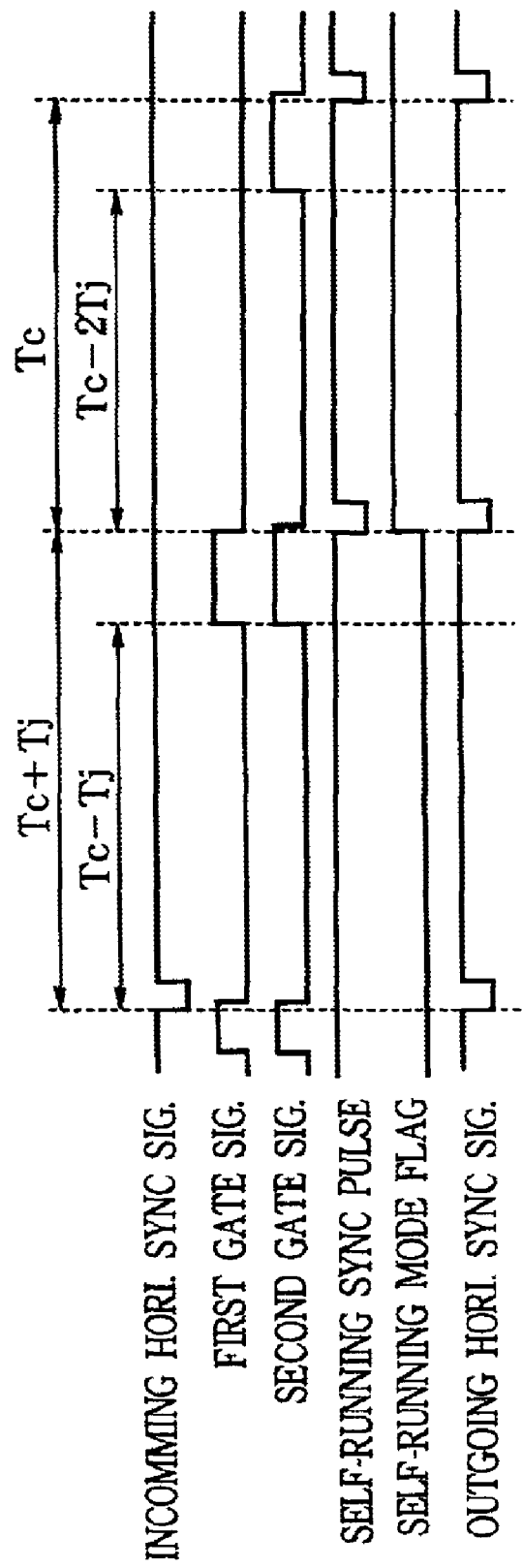
FIG. 5 is a timing chart for explaining the operation of the first example.

FIG. 5 shows a case where the input of horizontal sync signals to the input terminal 1 is interrupted at some point in time. A first self-running synchronizing pulse is produced after a lapse of a time of Tc+Tj which is longer than the horizontal scanning period Tc after the last horizontal sync signal is input. On the other hand, a second and further self-running synchronizing pulses are produced at intervals of the horizontal scanning period Tc.

Figure 6:
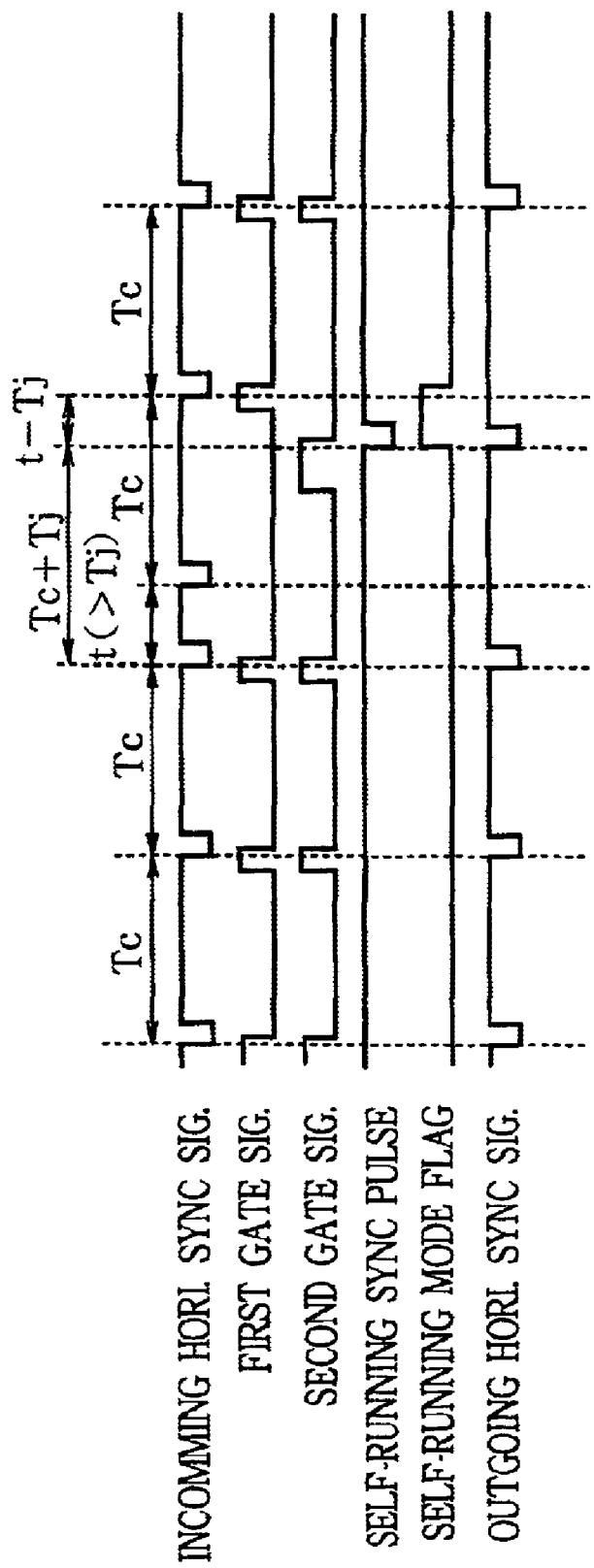
FIG. 6 is a timing chart for explaining the operation of the first example.

FIG. 6 shows a case where, when horizontal sync signals are entering at the input terminal 1 at regular intervals of Tc, two horizontal sync signals are input in succession within a very short time period t (t>Tj), and then horizontal sync signals are input at regular intervals of Tc again. In this example, even when an abrupt phase shift has occurred to horizontal sync signals entering at the input terminal 1, the first counter 2 is reset each time a sync signal is input through the input terminal 1. Accordingly, horizontal sync signals entering at the input terminal 1 after a lapse of the horizontal scanning period Tc after the two horizontal sync signals are input in succession within the very short time period t appear while the first gate signal indicates the open state and therefore can pass through the first gate circuit 8. Since a reset signal is produced by the reset signal producing circuit 11 at that time, the second counter 4 is reset as well, so a horizontal sync signal being input after further lapse of Tc can pass through the second gate 9. As described above, with the synchronizing signal processing circuit of this example, it is possible to avoid horizontal sync signals from being output at short intervals, and to synchronize its output with its input quickly.

Although the first example uses the mode determination circuit 5 to make the period of the self-running synchronizing pulses produced while the self-running mode flag is set equal to Tc, it is possible to dispense with the mode determination circuit 5 if there arises no problem when the period of the self-running synchronizing pulses is longer than Tc.

Although the output of the second gate circuit 9 is supplied to the synchronizing pulse producing circuit 10 in the first example, it is possible to remove the second gate circuit 9 and supplies the synchronizing pulse producing circuit 10 with the output of the first gate circuit 8. In this case, when incoming horizontal sync signals are such as shown in FIG. 6, a horizontal sync signal entering at the input terminal 1 just after the self-running pulse is output from the output terminal 12 will appear at the output terminal 12. This structure is useful in a case where synchronizing horizontal sync signals output from the output terminal 12 with incoming horizontal sync signals quickly has precedence over avoiding horizontal sync signals from being output at short intervals. The same advantage can be obtained for a case where the input terminal 1 receives vertical sync signals instead of horizontal sync signals.

Figure 7:
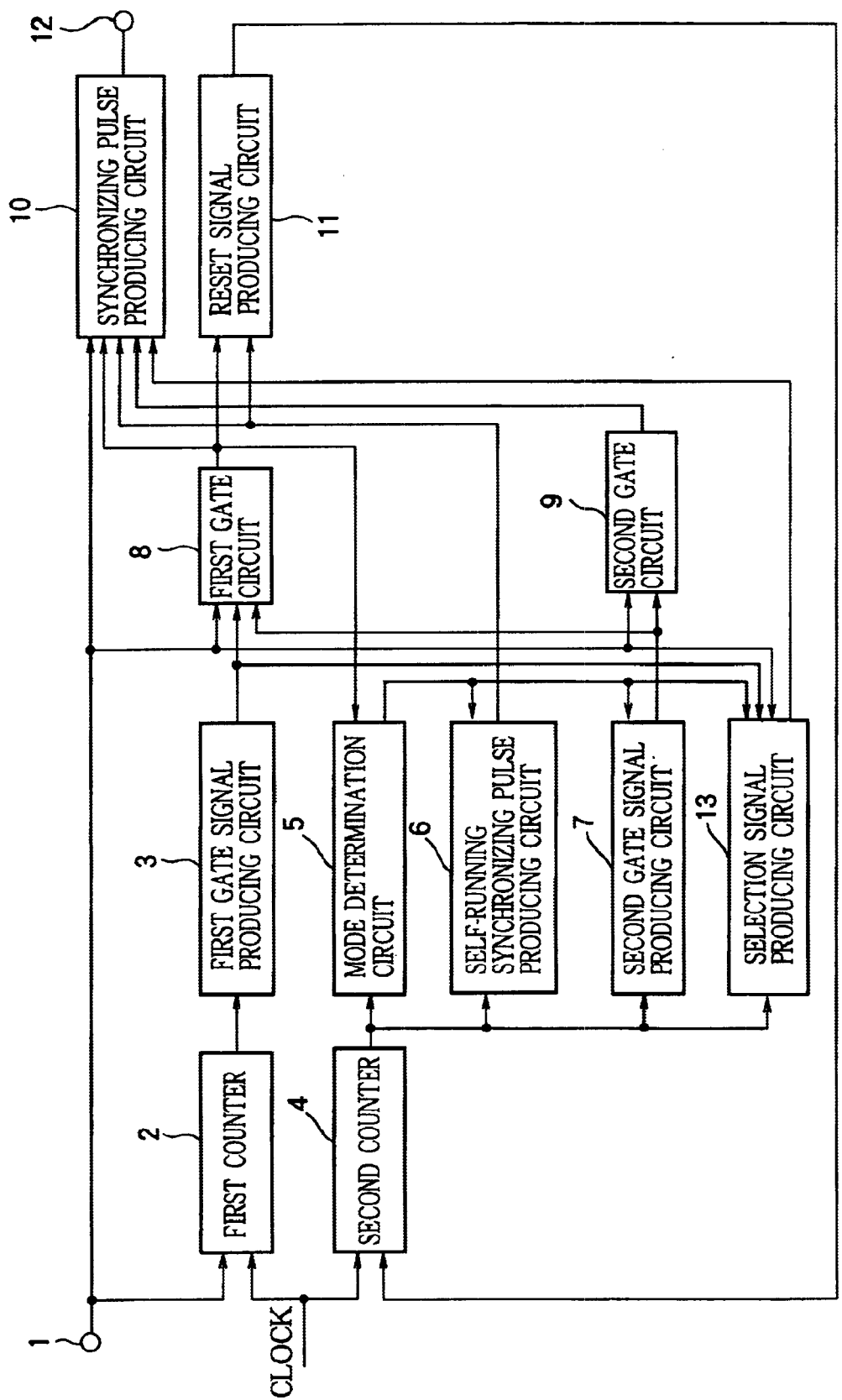
FIG. 7 is a block diagram showing a structure of a second example of the synchronizing signal processing circuit according to the present invention.

FIG. 7 is a block diagram showing a structure of a second example of the synchronizing signal processing circuit according to the invention. In FIG. 7, reference numerals identical to those in FIG. 1 represent the same or corresponding elements.

The second example is different from the first example in that the output of the first gate circuit 8 is supplied to the synchronizing pulse producing circuit 10, and a selection signal producing circuit 13 which produces a selection signal and outputs it to the synchronizing pulse producing circuit 10 is added.

The selection signal produced by the selection signal producing circuit 13 indicates which of the output of the first gate circuit 8 and the self-running synchronizing pulse produced by the self-running pulse producing circuit 6 has higher priority. The synchronizing pulse producing circuit 10 outputs a synchronizing pulse which it has produced from an output of the first gate circuit 8 if the selection signal is set, while outputs a synchronizing pulse which it has produced from a self-running synchronizing pulse or an output of the second gate circuit 9 if the selection signal is reset. The selection signal is set when a horizontal sync signal enters at the input terminal 1 while the self-running mode flag is cleared by the mode determination circuit 5 and the first gate signal produced by the first gate signal producing circuit 3 indicates the closed state. The selection signal is reset either when a horizontal sync signal enters at the input terminal 1 while the first gate signal indicates the open state, or when the count value of the second counter 4 reaches the third value while the self-running mode flag is set.

With the second example of the synchronizing signal processing circuit, it is possible synchronize outgoing synchronizing pulses with incoming horizontal sync signals more quickly than the first example, while avoiding synchronizing pulses from being output at short intervals when the phase of the incoming horizontal sync signal is shifted abruptly. The reason for this will be explained with reference to timing charts shown in FIGS. 8 and 9.

Figure 8:
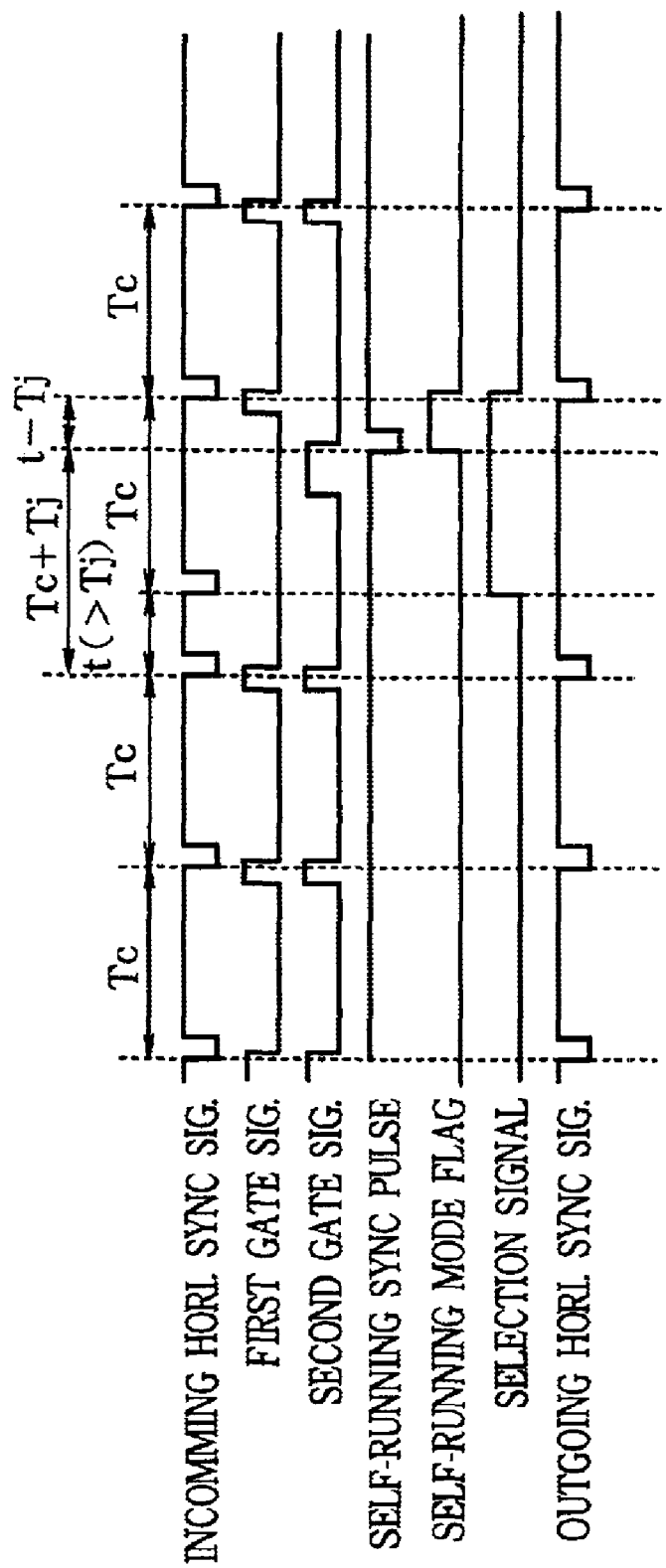
FIG. 8 is a timing chart for explaining the operation of the second example.

FIG. 8 is directed to a case where horizontal sync signals entering at the input terminal 1 are the same as those shown in FIG. 6. When two horizontal sync signals are input to the input terminal 1 in succession during a short time period t, the selection signal is set since the first gate signal produced by the first gate signal producing circuit 3 indicates the closed state at that point in time. Accordingly, any self-running synchronizing pulse does not appear at the output terminal 12, since even if the self-running synchronizing pulse producing circuit 6 produces a self-running synchronizing pulse after a lapse of Tc+Tj after the last horizontal sync signal is input before the two horizontal sync signals are input to the input terminal 1 in succession during a short time period t, the synchronizing pulse producing circuit 10 does not select it. On the other hand, a horizontal sync signal entering at the input terminal 1 after a lapse of t−Tj after the self-running synchronizing pulse is produced appears at the output terminal 12 by way of the first gate circuit 8 and the synchronizing pulse producing circuit 10, since the selection signal has been set. By comparing the timing chart shown in FIG. 6 of the first example with the timing chart shown in FIG. 8 of the second example, it is apparent that the second example can synchronize its output with its input earlier than the second example by one horizontal scanning period Tc.

Figure 9:
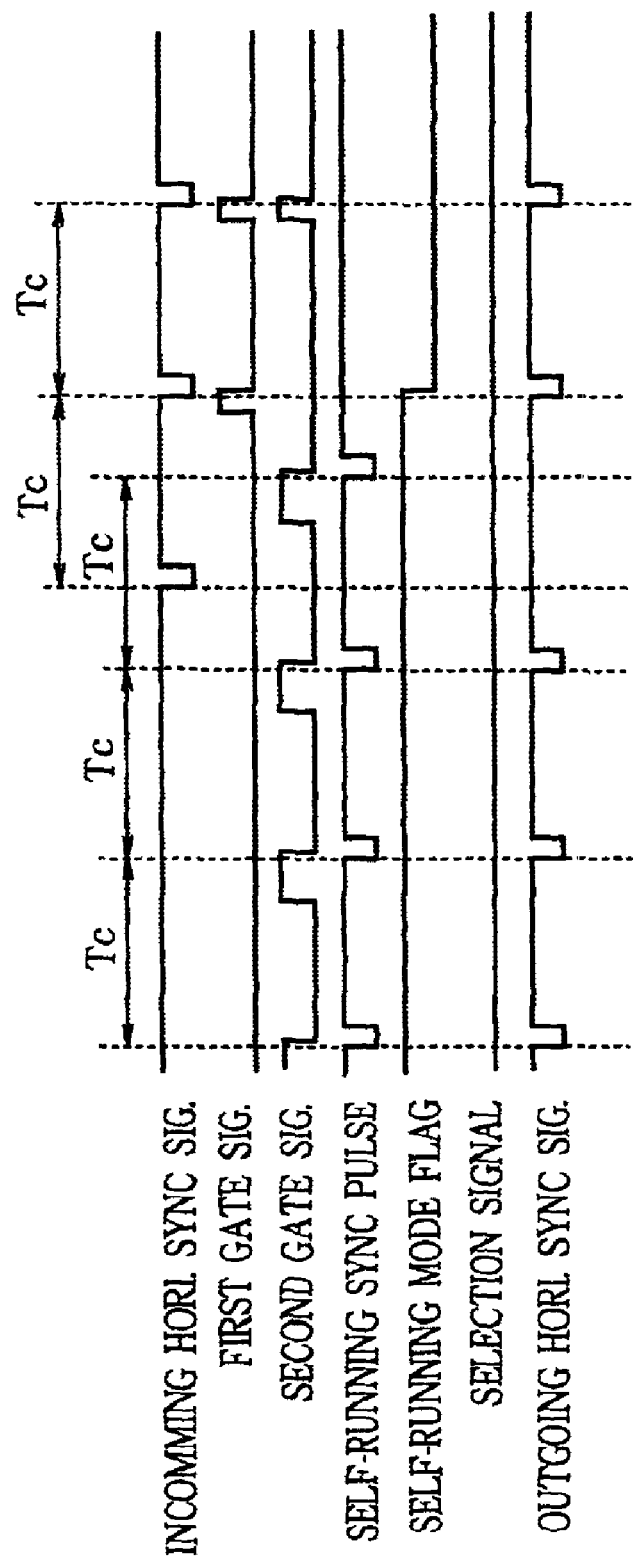
FIG. 9 is a timing chart for explaining the operation of the second example.

FIG. 9 shows a case where the input of horizontal sync signals to the input terminal 1 is resumed at some point in time after a temporary interruption of the input. During the interruption, the self-running mode flag is set and the selection signal is reset so that the self-running synchronizing pulse producing circuit 6 produces a self-running synchronizing pulse when the count value of the second counter 4 reaches the third value. Accordingly, when the input of horizontal sync signals to the input terminal 1 is resumed, the output of the first gate circuit 8 is not selected, so it is possible to avoid synchronizing pulses from being output at short intervals.

During video reproduction by a VCR, equalizing pulses or cut-in pulses included in each vertical blanking period can enter the input terminal 1 as shown in FIG. 8. Generally, a pixel clock necessary for processing digital video signals in a vide apparatus are obtained by supplying horizontal sync signals to a PLL. To obtain the pixel clock having a stable period from the PLL before an image display period, it is necessary to supply the PLL with reference edges of true horizontal sync signals and not self-running synchronizing pulses as early as possible. Accordingly, in a case as shown in FIG. 8, it is desirable that the synchronizing pulse producing circuit 10 waits for the input of the next horizontal sync signal without outputting any self-running synchronizing pulse.

It is also necessary not to supply the PLL with horizontal sync signals having a short period for the frequency of the pixel clock not to exceed a maximum clock frequency of a digital vide signal processing circuit. Accordingly, in a case as shown in FIG. 9, it is desirable that, after the last self-running synchronizing pulse is output, the synchronizing pulse producing circuit 10 waits for the input of the next horizontal sync signal which will appear after a lapse of Tc without selecting the output of the first gate circuit 8. For such reasons, the second example is configured to synchronize its output with its input more quickly than the first example, while avoiding synchronizing pulses from being output at short intervals when the phase of incoming horizontal sync signals is shifted abruptly.

Figure 10:
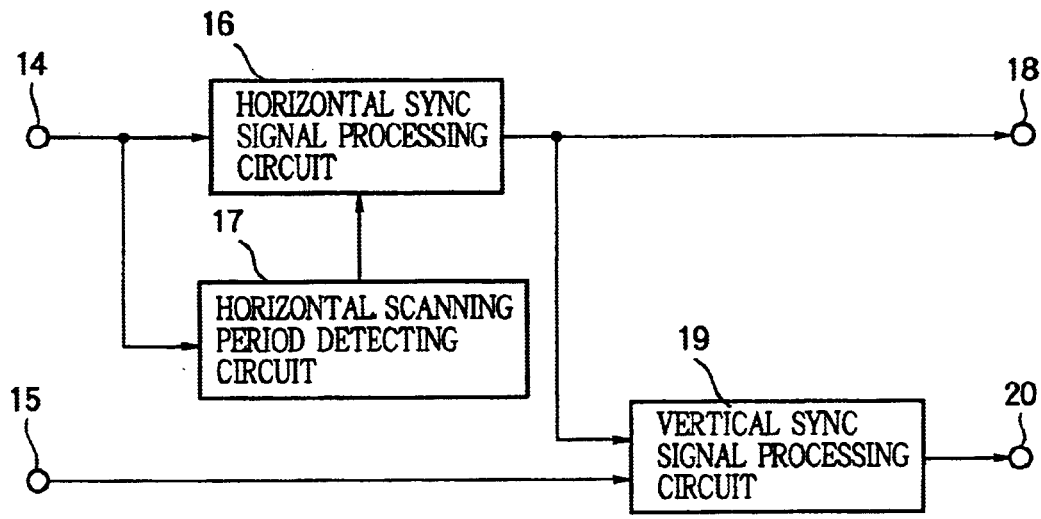
FIG. 10 is a block diagram showing a structure of a third example of the synchronizing signal processing circuit according to the present invention.
Figure 11:
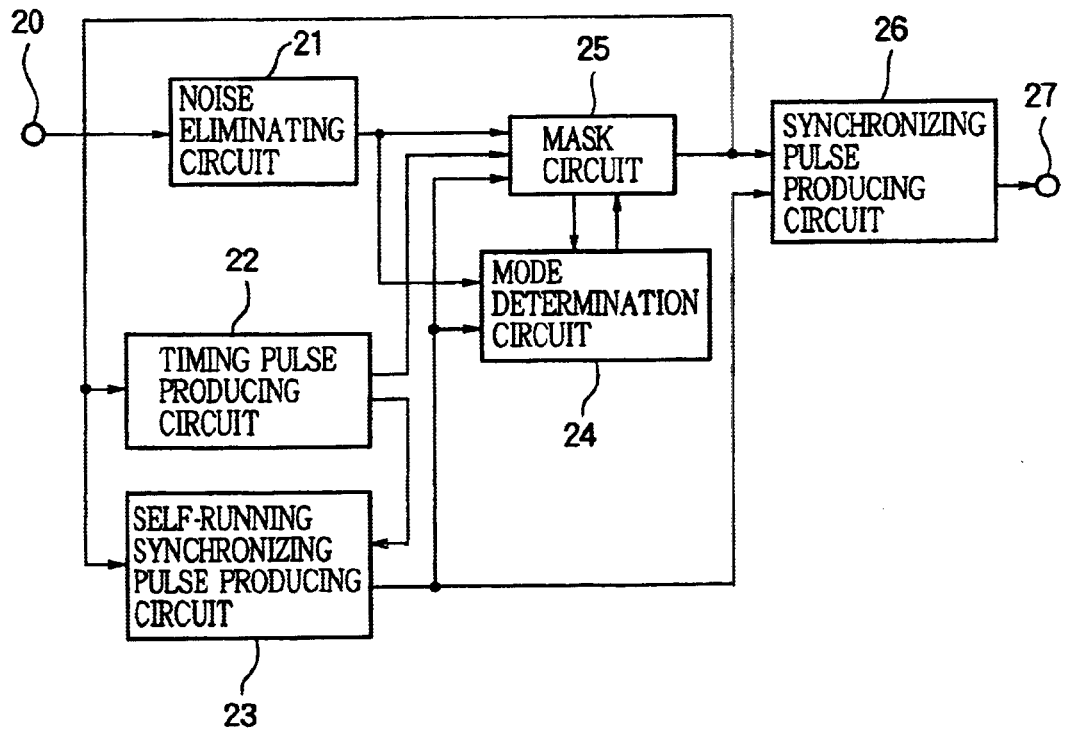
FIG. 11 is a block diagram showing a structure of a conventional synchronizing signal processing circuit.
Figure 12:
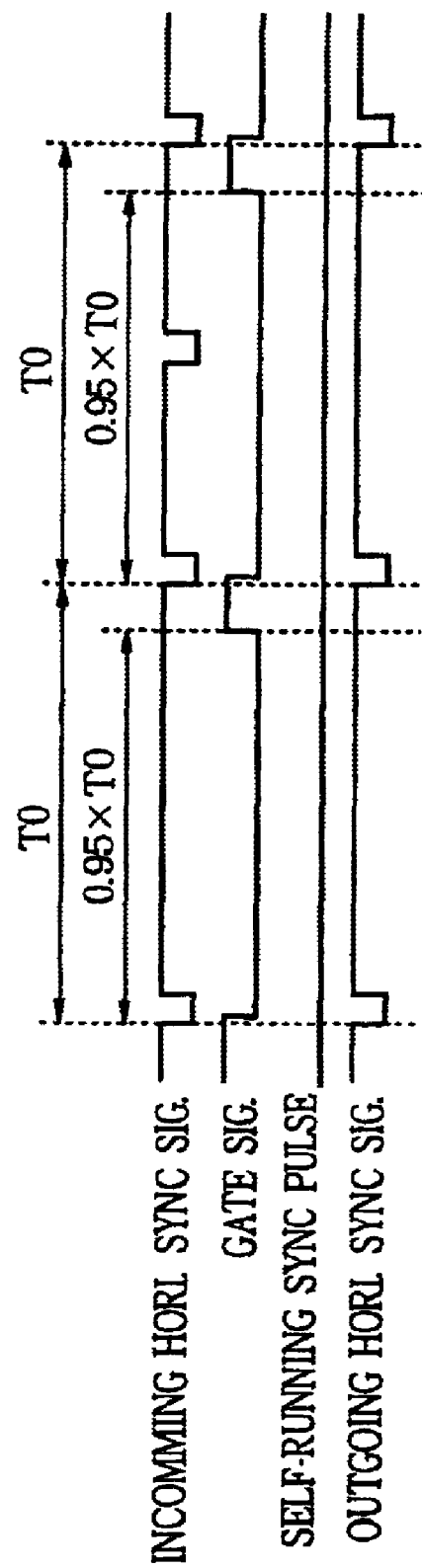
FIG. 12 is a timing chart for explaining the operation of the conventional synchronizing signal processing circuit.
Figure 13:
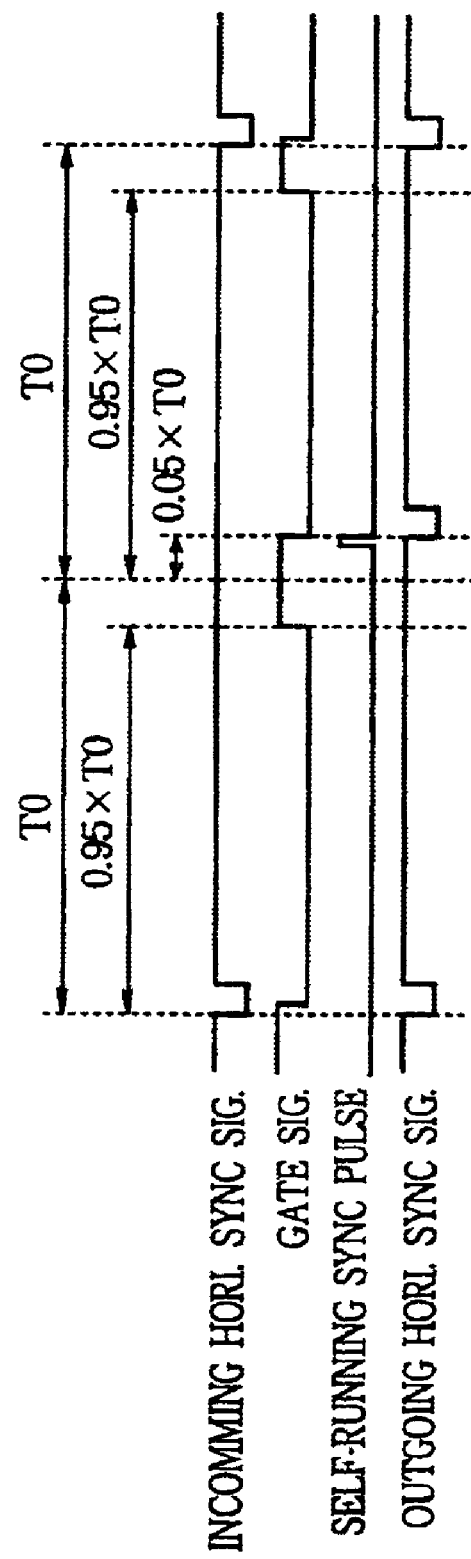
FIG. 13 is a timing chart for explaining the operation of the conventional synchronizing signal processing circuit.
Figure 14:
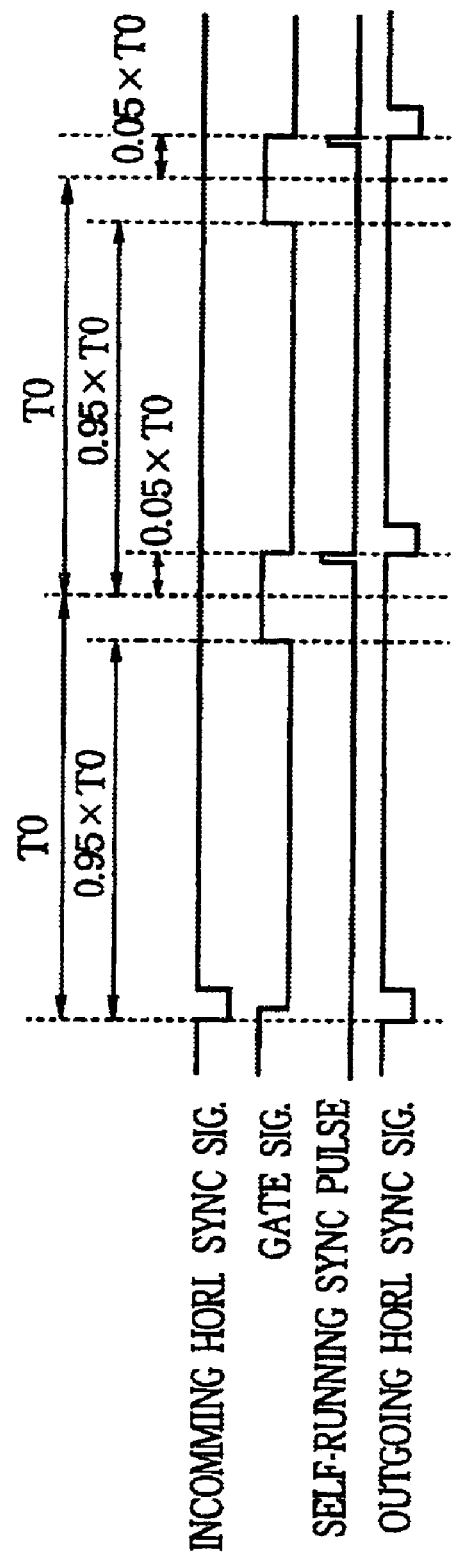
FIG. 14 is a timing chart for explaining the operation of the conventional synchronizing signal processing circuit.
Figure 15:
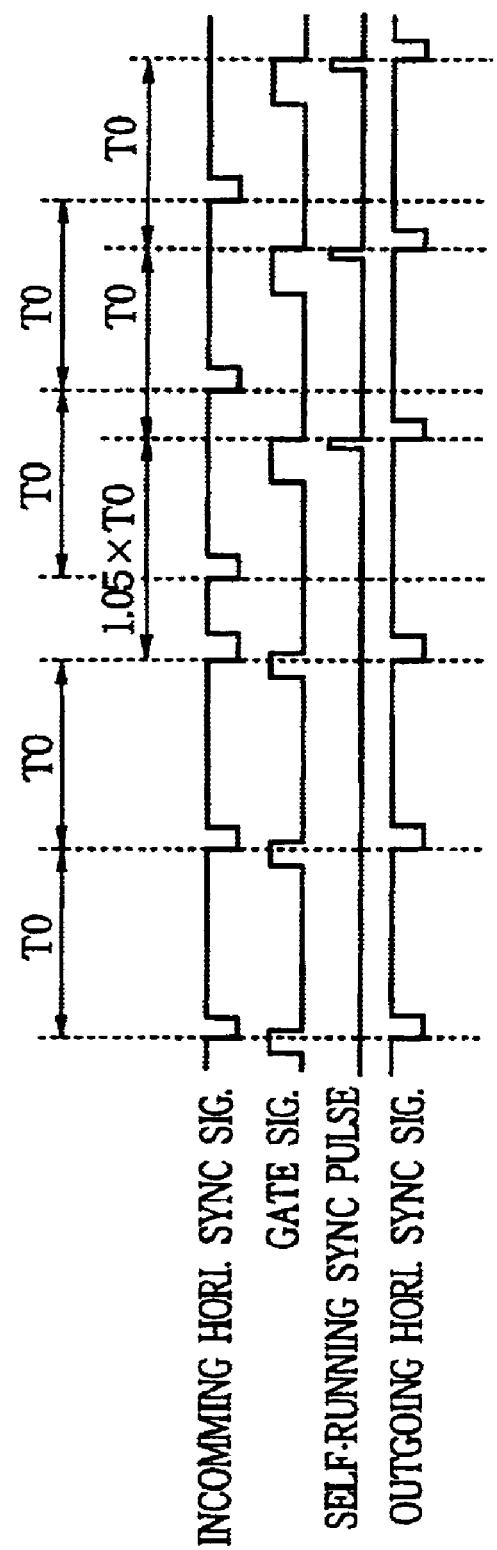
FIG. 15 is a timing chart for explaining the operation of the conventional synchronizing signal processing circuit.
Figure 16:
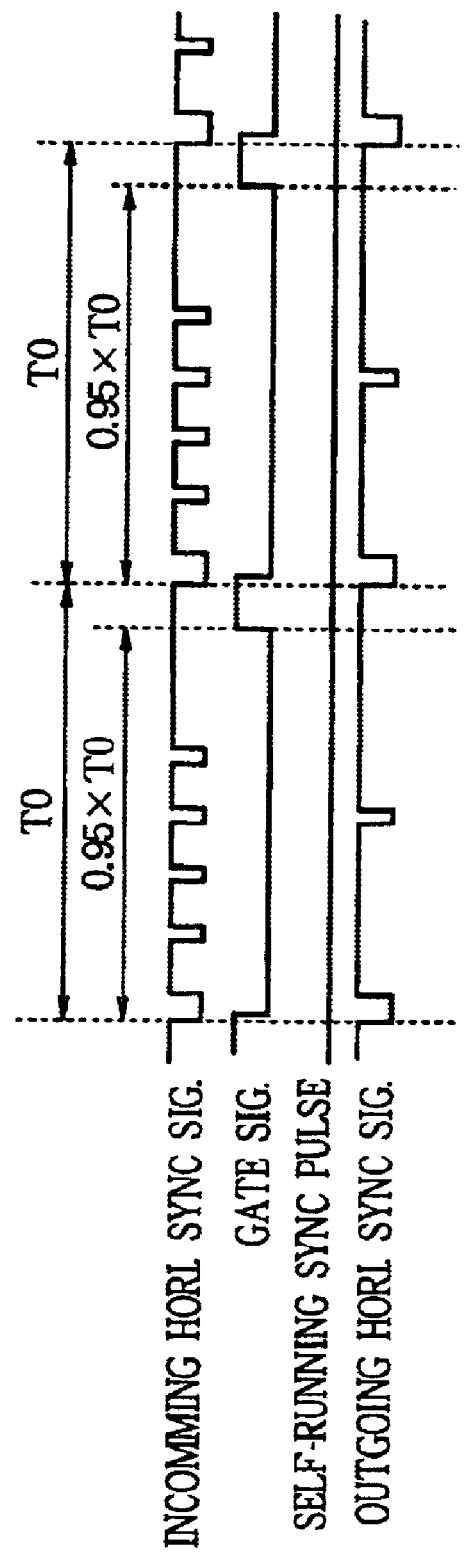
FIG. 16 is a timing chart for explaining the operation of the conventional synchronizing signal processing circuit.

FIG. 10 shows a structure of a third example of the synchronizing signal processing circuit according to the invention. The third example is configured to process incoming horizontal sync signals by use of the synchronizing signal processing circuit of the second example and process incoming vertical sync signals by use of the synchronizing signal processing circuit of the first example. In FIG. 10, 14 denotes an input terminal for receiving horizontal sync signals, 15 denotes an input terminal for receiving vertical sync signals, 16 denotes a horizontal synchronizing signal processing circuit, 18 denotes an output terminal for outputting horizontal sync pulses, 19 denotes a vertical sync signal processing circuit, and 20 denotes an output terminal for outputting vertical sync pulses.

The structure and the operation of the horizontal sync signal processing circuit 16 are the same as those of the synchronizing signal processing circuit of the second example except that the first, second, third, and fourth values are set on the basis of a period of incoming horizontal sync signals detected by a horizontal scanning period detecting circuit 17.

The horizontal scanning period detecting circuit 17 updates the period of incoming horizontal sync signals each time horizontal sync signals for 32 lines (32 horizontal scanning lines) which define about the same horizontal scanning period are input. Specifically, if a difference between a horizontal scanning period defined by a preceding horizontal sync signal and that defined by a succeeding horizontal sync signal is smaller than 1/64 the horizontal scanning period defined by the preceding horizontal sync signal, they are regarded as about the same. The horizontal scanning period detecting circuit 17 adds up horizontal scanning periods regarded as about the same. When 32 consecutive horizontal scanning periods regarded as about the same have been added up, the horizontal scanning period detecting circuit 17 outputs a value equal to 1/32 the sum total as a detected period to the horizontal sync signal processing circuit 16. If horizontal scanning periods defined by two consecutive horizontal sync signals have been regarded as different, the horizontal scanning period detecting circuit 17 clears the total sum at this point, and restarts the addition.

The horizontal sync signal 16 can determine the first to fourth values by setting the value of Tc to the detected period output from the horizontal scanning period detecting circuit 17, and setting the value of Tj to 1/32 the value of Tc for example. Thus, the horizontal sync signal processing circuit 16 can adapt to different horizontal scanning frequencies without any external adjustment or setting.

The operation of the vertical sync signal processing circuit 19 is the same as that of the synchronizing signal processing circuit of the first example except that reference edges of horizontal sync signals output from the horizontal sync signal processing circuit 16 are supplied to the first counter 2 and the second counter 4 as a clock. The vertical scanning period is far longer than the horizontal scanning period, and therefore, if the first counter 2 and the second counter 4 are configured to count the same clock used in the horizontal sync signal processing circuit 16, their circuit scales become large since they must count a large number of clock pulses. Accordingly, in the third example, the first counter 2 and the second counter 4 within the vertical sync signal processing circuit 19 are supplied with reference edges of horizontal sync signals as clocks so that the first to fourth values are values associated with the number of the horizontal scanning lines, thereby reducing the circuit scale of the vertical sync signal processing circuit 19.

The horizontal sync signal producing circuit 16 can output horizontal sync signals having a stable period as explained in the second example even when false synchronizing pulses having a short period are included in horizontal sync signals entering at the input terminal 14 or even when there are missing pulses Accordingly, it is possible to output vertical sync signals with practically sufficient precision if incoming vertical sync signals are processed on the basis of the number of horizontal scanning lines.

Although the vertical sync signal processing circuit of the third example is not provided with a circuit for detecting a vertical scanning period of incoming signals, a circuit similar to the horizontal scanning period detecting circuit 17 may be provide for detecting a period of incoming vertical sync signals to be capable of processing PC signals having a different vertical scanning period and also supporting different standards such as NTSC and PAL.

Although the synchronizing signal processing circuit of the first example is used for processing incoming vertical sync signals in the third example since vertical sync signals generally do not affect a frequency of the pixel clock produced by a PLL, the synchronizing signal processing circuit of the second example may be used for processing incoming vertical sync signals.

The above explained preferred embodiments are exemplary of the invention of the present application which is described solely by the claims appended below. It should be understood that modifications of the preferred embodiments may be made as would occur to one of skill in the art.

What is claimed is:

1. A synchronizing signal processing circuit for producing, from a first synchronizing signal entering thereto, a second synchronizing signal to be output therefrom, the synchronizing signal processing circuit comprising:

a first counter counting a clock of a predetermined frequency and being reset each time an entry of the first synchronizing signal is detected;

a first gate signal producing circuit for producing a first gate signal which changes to an open state when a count value of the first counter reaches a first value, and changes to a closed state when the first counter is reset and when the count value of the first counter reaches a second value larger than the first value;

a second counter counting the clock and being reset upon each reception of a reset signal;

a self-running synchronizing pulse producing circuit for producing a self-running synchronizing pulse when a count value of the second counter reaches the second value;

a second gate signal producing circuit for producing a second gate signal which changes to the open state when the count value of the second counter reaches the first value, and changes to the closed state when the second counter is reset;

a first gate circuit allowing the first synchronizing signal to pass when at least one of the first and the second gate signals indicates the open state, and blocking the first synchronizing signal at other times;

a synchronizing pulse producing circuit for producing a synchronizing pulse to be output as the second synchronizing signal upon reception of the first synchronizing signal from the first gate circuit and upon reception of the self-running synchronizing pulse from the self-running synchronizing pulse producing circuit; and a reset signal producing circuit outputting the reset signal to the second counter upon reception of the first synchronizing signal from the first gate circuit and upon reception of the self-running synchronizing pulse from the self-running synchronizing pulse producing circuit.

2. A synchronizing signal processing circuit according to claim 1, further comprising a mode determination circuit which sets a self-running mode flag when the count value of the second counter reaches the second value and clears the self-running mode flag when the first synchronizing signal passes through the first gate circuit;

the self-running synchronizing pulse producing circuit producing the self-running synchronizing pulse when the count value of the second counter reaches the second value if the self-running mode flag is cleared, and when the count value of the second counter reaches a third value larger than the first value and smaller than the second value if the self-running mode flag is set;

the second gate signal produced by the second gate signal producing circuit changing to the open state when the count value of the second counter reaches the first value if the self-running mode flag is cleared, and when the count value of the second counter reaches a fourth value smaller than the first value if the self-running mode flag is set.

3. A synchronizing signal processing circuit according to claim 2, further comprising a selection signal producing circuit for producing a selection signal which is set when an entry of the first synchronizing signal is detected if the self-running mode flag is cleared and the first gate signal indicates the closed state, and reset when the count value of the second counter reaches the third value if the self-running mode flag is set and when the first synchronizing signal passes through the first gate circuit irrespective of a state of the self-running mode flag;

the synchronizing pulse producing circuit producing a synchronizing pulse to be output as the second synchronizing signal upon reception of the first synchronizing signal from the second gate circuit and upon reception of the self-running synchronizing pulse from the self-running synchronizing pulse producing circuit if the selection is reset, while outputting the first synchronizing signal that has passed the first gate circuit as the second synchronizing signal if the selection signal is set.

4. A synchronizing signal processing circuit according to claim 2, further comprising a period detecting circuit for detecting a period of the first synchronizing signal, and a device for determining the first to fourth values on the basis of a value of the period detected by the period detecting circuit.

5. A synchronizing signal processing circuit according to claim 1, in which the first synchronizing signal is a vertical synchronizing signal, and the first and the second counters are supplied with a horizontal synchronizing signal as the clock.

6. A synchronizing signal processing circuit for producing, from a first synchronizing signal entering thereto, a second synchronizing signal to be output therefrom, the synchronizing signal processing circuit comprising:

a first counter counting a clock of a predetermined frequency and being reset each time an entry of the first synchronizing signal is detected;

a first gate signal producing circuit for producing a first gate signal which changes to an open state when a count value of the first counter reaches a first value, and changes to a closed state when the first counter is reset and when the count value of the first counter reaches a second value larger than the first value;

a second counter counting the clock and being reset upon each reception of a reset signal; a self-running synchronizing pulse producing circuit for producing a self-running synchronizing pulse when a count value of the second counter reaches the second value;

a second gate signal producing circuit for producing a second gate signal which changes to the open state when the count value of the second counter reaches the first value, and changes to the closed state when the second counter is reset;

a first gate circuit allowing the first synchronizing signal to pass when at least one of the first and the second gate signals indicates the open state, and blocking the first synchronizing signal at other times;

a second gate circuit allowing the first synchronizing signal to pass when the second gate signal indicates the open state, and blocking the first synchronizing signal at other times;

a synchronizing pulse producing circuit for producing a synchronizing pulse to be output as the second synchronizing signal upon reception of the first synchronizing signal from the second gate circuit and upon reception of the self-running synchronizing pulse from the self-running synchronizing pulse producing circuit;

a reset signal producing circuit outputting the reset signal to the second counter upon reception of the first synchronizing signal from the first gate circuit and upon reception of the self-running synchronizing pulse from the self-running synchronizing pulse producing circuit.

7. A synchronizing signal processing circuit according to claim 6, further comprising a mode determination circuit which sets a self-running mode flag when the count value of the second counter reaches the second value and clears the self-running mode flag when the first synchronizing signal passes through the first gate circuit;

the self-running synchronizing pulse producing circuit producing the self-running synchronizing pulse when the count value of the second counter reaches the second value if the self-running mode flag is cleared, and when the count value of the second counter reaches a third value larger than the first value and smaller than the second value if the self-running mode flag is set;

the second gate signal produced by the second gate signal producing circuit changing to the open state when the count value of the second counter reaches the first value if the self-running mode flag is cleared, and when the count value of the second counter reaches a fourth value smaller than the first value if the self-running mode flag is set.

8. A synchronizing signal processing circuit according to claim 7, further comprising a selection signal producing circuit for producing a selection signal which is set when an entry of the first synchronizing signal is detected if the self-running mode flag is cleared and the first gate signal indicates the closed state, and reset when the count value of the second counter reaches the third value if the self-running mode flag is set and when the first synchronizing signal passes through the first gate circuit irrespective of a state of the self-running mode flag;

the synchronizing pulse producing circuit producing a synchronizing pulse to be output as the second synchronizing signal upon reception of the first synchronizing signal from the second gate circuit and upon reception of the self-running synchronizing pulse from the self-running synchronizing pulse producing circuit if the selection is reset, while outputting the first synchronizing signal that has passed the first gate circuit as the second synchronizing signal if the selection signal is set.

9. A synchronizing signal processing circuit according to claim 7, further comprising a period detecting circuit for detecting a period of the first synchronizing signal, and a device for determining the first to fourth values on the basis of a value of the period detected by the period detecting circuit.

10. A synchronizing signal processing circuit according to claim 6, in which the first synchronizing signal is a vertical synchronizing signal, and the first and the second counters are supplied with a horizontal synchronizing signal as the clock.

* * * * *